United States Patent [19]

Halliday

[11] 3,739,447

[45] June 19, 1973

[54] PRINTED CIRCUIT BOARD ASSEMBLY AID

[75] Inventor: Robert B. Halliday, Chenango Forks, N.Y.

[73] Assignee: The Singer Company, New York, N.Y.

[22] Filed: Apr. 30, 1971

[21] Appl. No.: 139,054

[52] U.S. Cl. ............................................ 29/203 B
[51] Int. Cl. ............................................ H05k 13/04
[58] Field of Search ...................... 29/203 B, 203 R, 29/407, 203 P, 626

[56] References Cited

UNITED STATES PATENTS 3,372,455 3/1968 Howie .............................. 29/407 X
3,611,544 10/1971 Frels et al....................... 29/203 BX

*Primary Examiner*—Thomas H. Eager
*Attorney*—Francis L. Masselle, William Grobman and Charles S. McGuire

[57] ABSTRACT

Apparatus for assisting an operator in the selection, from a plurality of individual bins, of each component to be assembled on a conventional printed circuit board. A probe is provided for manual insertion by the operator through the holes in the p. c. board. The latter is held in a fixture in superimposed relation to conducting paths which have been prepared for the particular board to be assembled. An electrical power supply is connecting through the probe, and the conducting path contacted thereby when inserted through any particular hole in the board, to a lamp on the bin containing the component whose leads are to be inserted through that hole.

8 Claims, 5 Drawing Figures

INVENTOR:
Robert B. Halliday
BY
Charles S. McGuire
ATTORNEY

Robert B. Halliday
INVENTOR.

BY Charles S. McGuire
ATTORNEY

*Robert B. Halliday*
INVENTOR.

BY *Charles S. McGuire*
ATTORNEY

PRINTED CIRCUIT BOARD ASSEMBLY AID

This invention relates to improved means for performing hand assembly operations such as loading components on a printed circuit board.

The widespread use of printed circuit boards are subassemblies in hundreds of different electrical products has made the hand assembly of components on such boards one of the greatest labor inputs to such products. Accordingly, any significant improvements in the time required for such assembly operations results in a direct and noticeable decrease in the manufacturing cost of the finished product. Such improvements, of course, include not only reductions in the direct time required to locate and load the components on the board, but also the time required to correct wiring errors and the like resulting from operator mistakes.

It is the normal present practice to provide a number of separate trays, bins, or the like, for holding the individual components to be loaded on the board. These bins are arranged in an efficient layout at the assembly workplace, and a holding fixture for the board may also be provided. A list of printed instructions, which may be keyed to a sketch of the board, tells the operator which component to select from its bin and where and how to place it on the board. Such a procedure assumes a good amount of familiarity on the part of the operator with the physical appearance of the components, as well as an ability to relate the verbalized and/or sketched instructions to the physical layout of the workplace and circuit board. Of course, repeated loading of a particular board according to the same set of instructions builds up operator efficiency to a certain point, but this may be accompanied by a greater frequency of operator errors as the tasks become more repetitious and attention more easily diverted.

In U.S. application Ser. No. 113,153, filed Feb. 8, 1971 and assigned to applicant's assignee, there is disclosed a semi-automated system for aiding in component selection and assembly on a p.c. board in a predetermined sequence controlled by punched-tape logic. The tape is advanced incrementally under the operator's control by actuation of a foot treadle switch, and the tape reader unit operates a system of relays connected to lamp bulbs on individual bins containing the various components and on a fixture holding the board being assembled. For each tape position, a bulb will be lit on one of the bins, indicating that a component from that bin is to be selected, and a bulb on the board where the component is to be placed, will also be lit. At the same time, a list of printed instructions concerning assembly procedures will also be incremented in a positioning device each time the tape is stepped to the next position.

The present invention has in common with the above-described system the segregation of the various components into individual bins, each having a separately actuable lamp bulb associated therewith. Also, the p.c. board is mounted on a fixture in a particular, superposed relation to means indicating the position on the board where the component is to be placed. The present invention, however, rather than operating from punched-tape logic related to but physically distinct from the board itself, utilizes means which coact directly with the board being assembled to indicate the component to be selected and its proper position on the board.

In the illustrated embodiment, the invention comprises an electrical probe having a needle-like tip for insertion through the holes provided in the p.c. board for the electrical component leads. The board being assembled is positioned in a fixture, as previously mentioned, in superposed, spaced relation to a second board which has been prepared with conducting paths cooperatively positioned with the holes in the first board. Contact of the probe tip, which is connected to a DC supply, with a conducting path on the second board provides a voltage to the lamp on the bin containing the component to be inserted in the hole in the first board through which the probe tip is then extending.

It is a principal object of the invention to provide a simple and inexpensive, yet effective system for aiding an operator in the selection of components for assembly on a printed circuit board and indicating the position on the board where each component is to be placed.

A further object is to provide a novel system for indicating the particular component to be inserted in any location on a printed circuit board.

Other objects of the invention will in part be obvious and will in part appear hereinafter.

The invention accordingly comprises the features of construction, combination of elements, and arrangement of parts, which will be exemplified in the construction hereinafter set forth, and the scope of the invention will be indicated in the claims.

For a fuller understanding of the nature and objects of the invention reference should be had to the following detailed description taken in connection with the accompanying drawings, in which.

Figure 1:
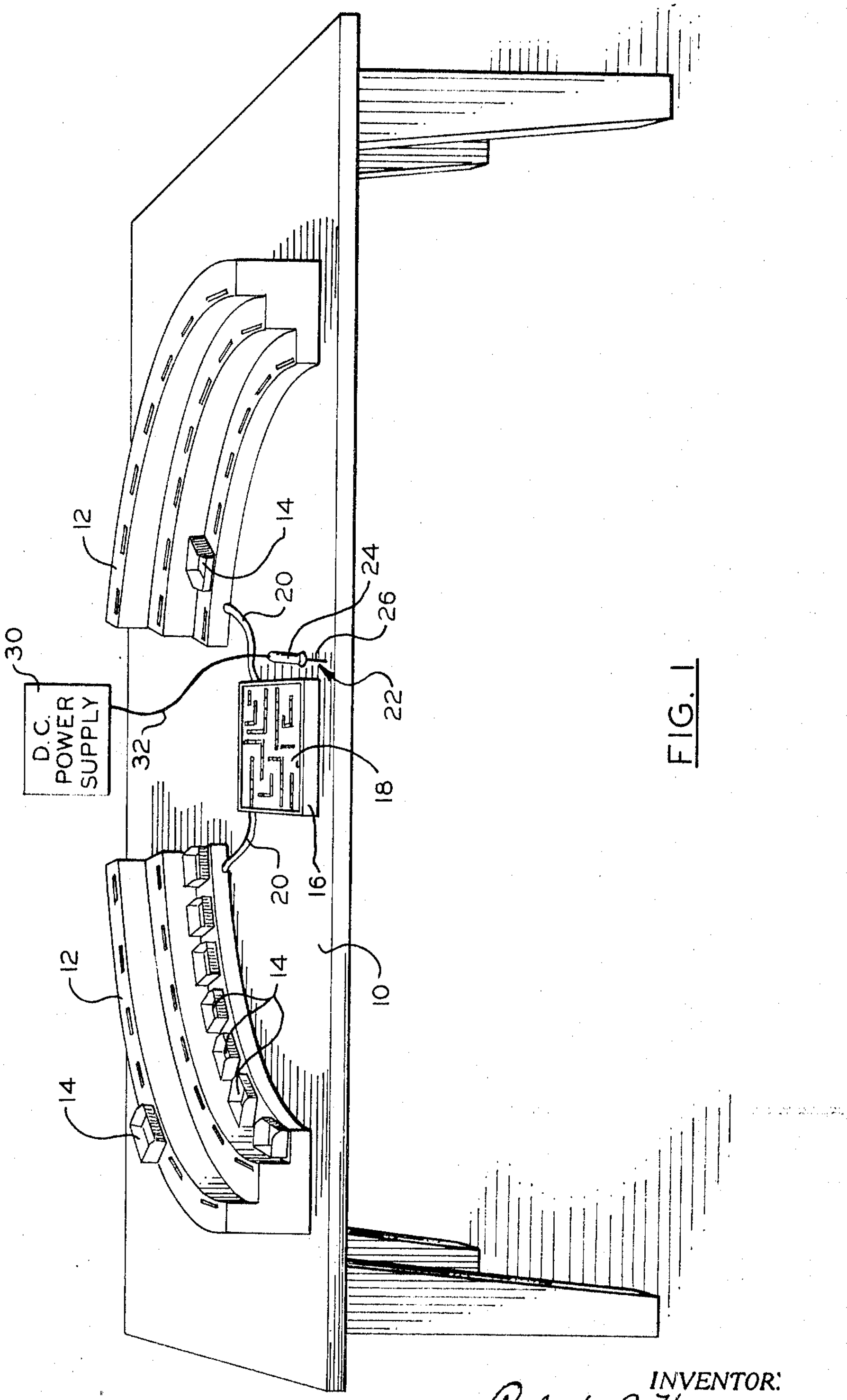
FIG. 1 is a perspective view of a suggested workplace layout wherein the invention is employed.

The workplace layout in FIG. 1 is considered typical of an operator's station for practising the invention. The operator is seated at table 10, which serves as a support for the major elements of the system. Shelves 12 support an array of individual bins 14, some of which are shown in position on the shelves, which hold the components to be loaded on the circuit board. The bins are preferably distributed approximately equally on each side of the operator and have a special construction cooperating with structure on shelves 12, as shown more fully in FIG. 2.

Holding fixture 16 is a generally box-like structure with an open top for receiving printed circuit board 18, the board upon which components from bins 14 are to be assembled. Electrical cables 20 comprise a bundle of individual wires extending between terminals associated with fixture 16 and individual lamp bulbs associated with each of bins 14, as described later in more detail. Probe element 22, comprising generally cylindrical body portion 24 and needle-like tip 26, is connected by electrical wire 28 to an appropriate DC power source, indicated schematically by block 30.

Figure 2:
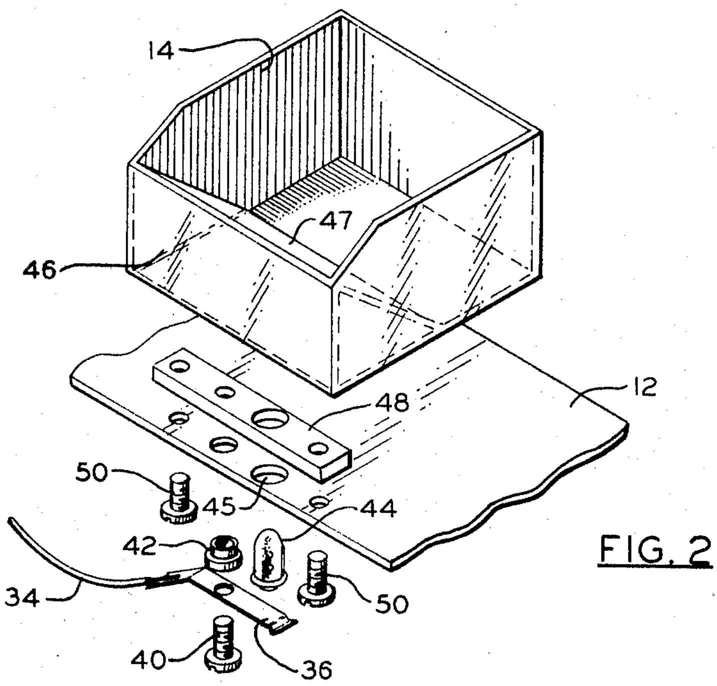
FIG. 2 is an enlarged, exploded perspective of portions of the elements of FIG. 1.

Referring now to FIG. 2, there is shown a fragment of shelf 12 and one of bins 14. One of the individual wires, indicated by the reference numeral 34, from cable 20 is connected to conducting strip 36 which is pivotally secured to shelf 12 by screw 40, but insulated therefrom by bushing 42. Strip 36 serves as an electrical contact for bulb 44 and also biases the base of the bulb into ground contact with shelf 12. The bulb is inserted through opening 45 in shelf 12 and is easily replaceable by virtue of the pivotal mounting of strip 36. Bin 14 is open on the bottom along one end behind front wall 46, so that bulb 44 extends into a hollow portion of the bin, separated by wall 47 from the open compartment which holds the components. In order to position the bin on the shelf and prevent inadvertent tipping or pushing out of position, bar 48 may be secured to the shelf by screws 50 and extend into the hollow portion of the bin behind front wall 46. Appropriate openings in bar 48 are provided, of course, for screw 40 and bulb 44. The material of which at least front wall 46 of each bin is constructed is transparent or translucent to the extent that light from the bulb associated therewith produces a visible indication distinguishing such bin from the others, the bulbs of which are not lit.

Figure 3:
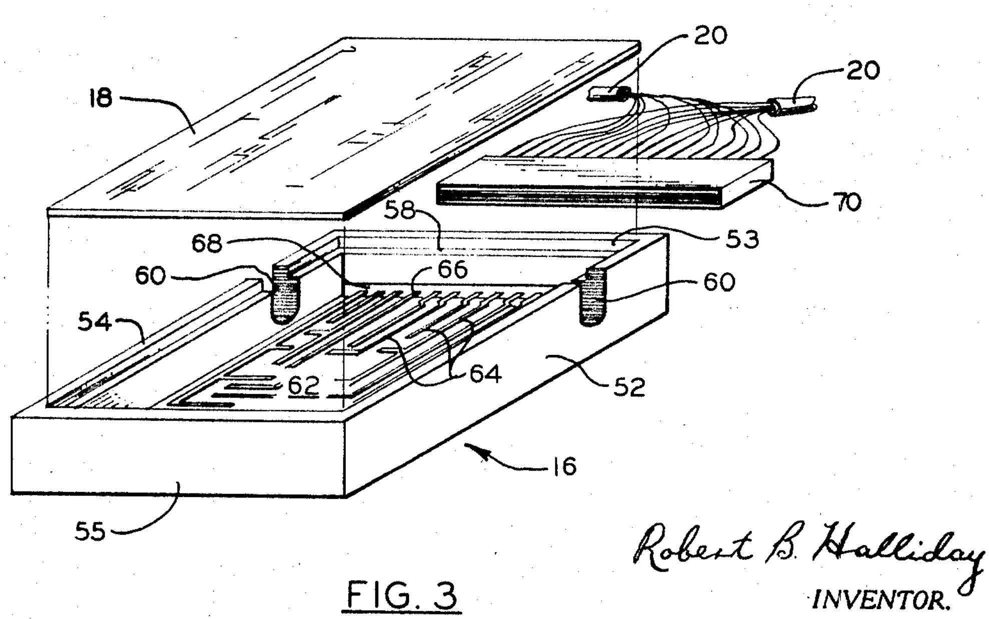
FIG. 3 is a perspective view, with portions broken away, of other elements of FIG. 1.
Figure 4:
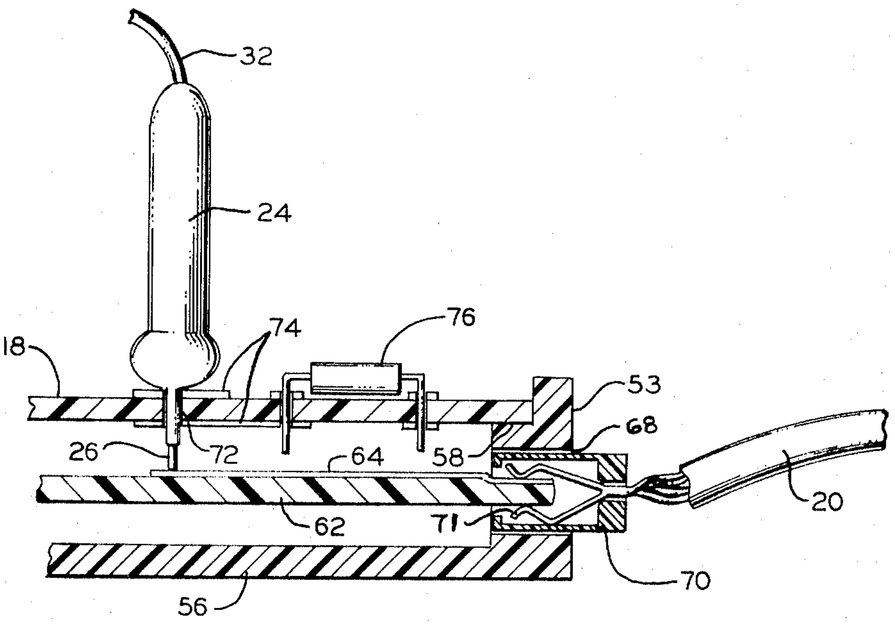
FIG. 4 is a side sectional view of the elements of FIG. 3.

The details of construction of holding fixture 16 are shown in FIGS. 3 and 4. As previously mentioned, the fixture is an essentially box-like structure with an open top, comprising side walls 52, 53, 54, 55 and bottom wall 56 (FIG. 4). Step 58 around the internal periphery of the side walls serves as a support for printed circuit board 18. Cut-out areas 60 in side walls 52 and 54 assist in manually inserting and removing the p.c. board. A second board 62, which may also be fabricated in the manner of a conventional printed circuit board, is supported within fixture 16 below board 18, in a predetermined positional relationship. Board 62 serves as a support for a plurality of conducting paths 64, e.g., individual metallic strips, each leading to a terminal along one side 66 of board 62. Opening 68 is provided across wall 53 of fixture 16 to accept side 66 of board 62. The individual wires of cable 20 are connected to respective terminals of elongated electrical connector 70 which may be inserted in opening 68 from outside fixture 16. Side 66 is plugged into connector 70 so that the terminals on board 62 are each engaged by one of the spring-biased contacts of the connector, such as contact 71 shown in FIG. 4.

The particular layout of conducting paths 64 on board 62 is determined by the positions of the holes, and the particular component to be inserted therein, on the particular p.c. board 18 which is to be assembled. That is, a different board 62 would be prepared for each different p.c. board 18 to be assembled. For p.c. boards of different sizes, it might also be desireable to provide different sized holding fixtures. This factor would not be significant, however, since the cost of preparing board 62 is comparable to that of a single p.c. board 18 and presumably a large number of such p.c. boards would be assembled with the aid of the matching board 62. Likewise, holding fixture 16 may be made of low cost materials in the most economical manner of fabrication available since the tolerances are not critical and the construction may be one-piece.

After layout of the p.c. board is known, board 62 may be prepared by connecting all the positions on the board which are adjacent holes on p.c. board 18 through which the leads of like components are to be inserted, when boards 62 and 18 are superposed with one another, by one of conducting paths 64. Such conducting path will lead to a specific terminal along side 66 of board 62 and will thus be connected, through the electrical connector and wire, to a specific bin lamp. In that bin will be placed the components to be assembled on p.c. board 18 in the holes superposed with the particular conducting path connected to that bin.

In operation, after board 62 had been prepared as explained above for use in the assembly of a particular p.c. board 18 and both boards have been placed in holding fixture 16, the operator inserts tip 26 of probe element 22 through any one of the holes in the p.c. board. It is also advisable to cover the upper portion 72 of tip 26 with an insulting coating to prevent electrical contact between the conducting tip, which is connected to the D.C. supply 30, and the conducting portions on each side of the p.c. board, such as those indicated at 74. Firm contact of the end of tip 26 with conducting path 64 will provide a circuit connection to the lamp 44 on the particular one of bins 14 which holds the component, one lead of which is to be inserted in the hole through which tip 26 is then extending. The lighting of the bulb provides an immediate visual indication to the operator of the bin from which a component is to be selected each time tip 26 is inserted through one of the holes in the p.c. board. Most of the common components for assembly on p.c. boards, e.g., resistors, capacitors, diodes, will have only two leads and the manner of assembly of the component on the board will be readily apparent once the particular component and one of the holes are located. The component may then be selected from the bin and placed on the board, in the manner of the component indicated at 76.

Special instructions may be required for some components, e.g., information regarding the particular orientation of certain components, sleeving required on leads, spacing of the component from the board, direction of diodes, etc. The bins containing such components may be provided with lamps having a color different from that of bin lamps indicating components requiring no special instructions. The operator's attention will therefore be directed to the fact that some additional information is required; such information may be printed on a separate sheet or booklet provided with the particular p.c. board, or may be printed on a card associated directly with the bin holding the components to which the instructions apply. It may be desirable in some cases to provide two different bins holding the same component, e.g., where special instructions are required for assembling the component in certain positions on the p.c. board while none are required when the same component is assembled in other positions.

Figure 5:
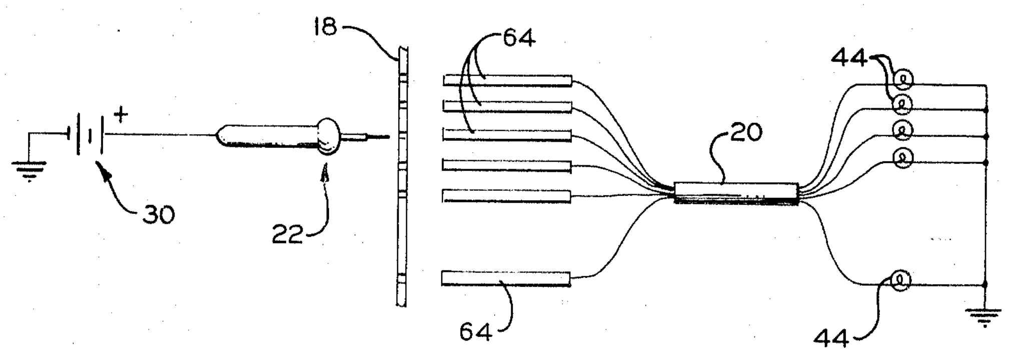
FIG. 5 is a partially schematic, partially diagrammatic illustration of the invention.

The diagram of FIG. 5 illustrates both the electrical and mechanical operation of the system. Probe 22 is connected to voltage source 30 and p.c. board 18 is interposed between the probe and conducting paths 64. Insertion of tip 26 through one of the holes in the p.c. board will complete a circuit to one of lamp bulbs 44 and thereby visually indicate the bin containing the particular components to be assembled on the board with one of its leads extending through the hole then occupied by the probe tip. Thus, the invention provides an extremely economical and efficient system for aiding an operator in the selection of components for assembly on a p.c. board in a manner which greatly reduces both assembly time and the probability of operator error over conventional types of manual assembly.

What is claimed is:

1. A system for facilitating the selection of a particular component, from a plurality of different components, and placing the component in a particular position on a printed circuit board, or the like, said system comprising, in combination:

a. a plurality of separate container means for holding the various components to be loaded on the board;
b. visual indicating means associated with each of said container means, actuable to distinguish any one of said container means from the others;
c. a plurality of individual electrical conducting paths arranged in a predetermined pattern;
d. means electrically connecting each of said conducting paths to selected, respective ones of said visual indicating means;
e. a holding fixture for positioning the printed circuit board in predetermined, juxtaposed relation to said conducting paths;
f. probe means having a tip portion selectively insertable through the holes of the printed circuit board wherein component leads are to be placed for contact with said conducting paths; and
g. means connecting said tip portion to a voltage supply, whereby contact of said tip portion with one of said conducting paths will actuate one of said visual indicating means to visually distinguish the one of said container means holding the component to be inserted in the hole then occupied by said tip portion.

2. The invention according to claim 1 wherein said visual indicating means comprise at least one electric lamp bulb associated with each of said container means.

3. The invention according to claim 2 wherein said conducting paths are arranged adjacent to one another in an essentially planar array and said holding fixture positions the printed circuit board in a substantially parallel, spaced plane with respect to said array.

4. The invention according to claim 3 wherein said conducting paths comprise metallic strips on a second board each leading to one of a row of terminals along an edge of said second board.

5. The invention according to claim 4 wherein said means connecting said paths to said indicating means includes a multi-contact electrical connector into which said edge of said second board is inserted, each of the connector contacts being wired to a respective one of said bulbs.

6. The invention according to claim 5 wherein said holding fixture comprises four vertical side walls defining a box structure having an open top with means therein for receiving the printed circuit board.

7. The invention according to claim 6 wherein said probe includes a body portion from which said tip portion extends and the latter includes an electrically insulating covering extending from said body portion for a part of its length.

8. The invention according to claim 2 wherein certain of said bulbs are of a different color from others.

* * * * *